United States Patent [19]

Tsuboi

[11] 4,388,387

[45] Jun. 14, 1983

[54] PROCESS FOR FORMING COLOR IMAGES

[75] Inventor: Masayoshi Tsuboi, Asaka, Japan

[73] Assignee: Fuji Photo Film Co., Ltd., Kanagawa, Japan

[21] Appl. No.: 133,998

[22] Filed: Mar. 26, 1980

[30] Foreign Application Priority Data

Mar. 26, 1979 [JP] Japan ................................ 55-35220

[51] Int. Cl.$^3$ ................................................ G03F 5/00

[52] U.S. Cl. ........................................ 430/7; 430/945; 430/235; 430/200; 430/201; 430/363; 430/365; 430/374; 430/294

[58] Field of Search ............... 430/235, 200, 201, 292, 430/293, 294, 324, 5, 7, 945, 374, 363, 365

[56] References Cited

U.S. PATENT DOCUMENTS

| | | | |
|---|---|---|---|
| 3,147,377 | 9/1964 | Newman | 430/200 |
| 4,081,277 | 3/1978 | Brault et al. | 430/235 |

*Primary Examiner*—Won H. Louie, Jr.

*Attorney, Agent, or Firm*—Sughrue, Mion, Zinn, Macpeak & Seas

[57] ABSTRACT

A process for forming color images which comprises providing a light absorbing dye layer or a dye containing layer on a base, at least the surface of which is composed of a transparent dye accepting polymer through which dyes are capable of thermally diffusing, imagewise exposing the dye layer or the dye containing layer to light having a high energy density such that a dye image is formed in the dye accepting polymer in the exposed area by thermal diffusion of the dye, and thereafter removing the dye or the dye containing layer in the unexposed areas.

9 Claims, No Drawings

PROCESS FOR FORMING COLOR IMAGES

BACKGROUND OF THE INVENTION

1. Field of the Invention

The present invention relates to a process for forming color images and particularly to a process for forming color images suitable for producing multicolor optical filters for color camera tubes or color solid-state camera devices.

2. Description of the Prior Art

In color tubes and color solid-state camera devices such as a charge coupled device (CCD), a charge injection device (CID) or a bucket brigade device (BBD), a multicolor striped or mosaic optical filter is used. Generally, in the multicolor optical filter, three colors comprising red, green and blue, or cyan, magenta or yellow are systematically arranged, but their color constitution is not always limited to these three colors and it sometimes comprises two colors or 4 or more colors.

Particularly, in the color optical filter used for the color solid-state camera devices, the filter must be placed as close to the surface of the solid-state camera device as possible in order to prevent color stain which occurs when light passing through the filter falls on an adjacent color element. A process for producing a multicolor optical filter which satisfies the above described requirements has been proposed in U.S. Pat. No. 4,081,277. This process comprises applying a cross-linkable gelatin photoresist to a dye accepting polymer layer through which the dye is capable of thermally diffusing, developing the photoresist layer by a conventional process to form a resist pattern, covering this pattern with a dye-containing binder layer such that the dye thermally diffuses into the exposed dye accepting layer, and removing the resist pattern to obtain a color image. This process is carried out repeatedly to form in turn color images each having a different color at a different position by which a multilayer color optical filter is produced. According to this process, since the multicolor filter is produced in one dye accepting polymer layer, it is possible to dispose the filter in close contact with the surface of the solid-state camera device and, consequently, light passing through the filter does not produce color stain in the formed image, because the light does not impinge on adjacent color elements in the solid-state camera device. Further, it is possible to attain a very high resolving power since the light hitting the solid-state camera device is correctly focused.

However, this process has the following shortcoming, a relief pattern composed of a gelatin photoresist is used as a mask in thermally diffusing the dye into the uncovered dye accepting layer. Because the gelatin photoresist layer is produced from a polymer similar to the dye accepting layer, the dye diffuses into not only the dye accepting layer but also into the relief pattern itself during thermal diffusion. If the gelatin resist layer is too thin, the dye diffuses into the dye accepting layer below the relief and causes fogging. Such fogging causes color stain in the case of a multicolor optical filter. If the thickness of the resist is increased in order to overcome this fault, diffusion of light occurs in the resist layer when it is imagewise exposed to light and it is impossible to obtain images having a high resolving power. Particularly, in case of carrying out exposure by closely contacting an optical mask in order to obtain fine striped or small mosaic images as in case of the multicolor optical filter, images having the desired size can not be obtained, because the light is diverted behind the mask image.

Further, if it is attempted to thermally diffuse a second dye and a third dye into the dye accepting polymer containing the first dye image formed previously in order to obtain a multicolor optical filter using the above described process, the dyes previously thermally diffused into the dye accepting polymer thermally diffuse into other materials during the thermal diffusion step to destroy the dye image and deteriorate the sharpness of the edges of the image.

On the other hand, the process described in British Pat. No. 1,353,063 has been known as one of those recording processes using light having a high energy density such as a laser, etc. This process is a marking process which comprises supplying fine particles such as a pigment, etc. to the surface of an element having a thermofusible surface so as to form a thin layer, applying a laser beam to the fine particle layer to fuse the thermofusible layer by which the fine particles in the fused areas are fixed to the thermofusible layer. The fine particles which are not fixed are then removed from the surface.

This process is effective for scribing the surface of, for example, a steel plate, etc. However, this process suffers the following drawback, when it is used to obtain, a multicolor optical filter. Namely, since the color image obtained by this process is formed by fusing the thermofusible surface to which the laser beam is applied, light passing through this color image is scattered in the filter and, consequently, in case of, particularly, a filter for a color solid-state camera device, the light passing through the filter hits adjacent color elements in the solid-state camera device and causes color stain on the formed image. Further, since the light transmittance is naturally reduced in the fused areas, it becomes impossible to produce a preferred filter.

SUMMARY OF THE INVENTION

It has been found that when a light absorbing dye layer or a dye containing layer is provided on a base at least the surface of which is composed of a transparent dye accepting polymer through which dyes are capable of thermally diffusing, and a laser beam is applied to the dye layer or dye containing layer, a color image can be formed by diffusion of the dye into the polymer without fusing the dye accepting polymer layer.

Accordingly, an object of the present invention is to produce color micro patterns having a very high resolving power.

Another object of the present invention is to produce color micro patterns or multicolor optical filters in which multicolor images are formed on a single face or layer.

A further object of the present invention is to produce multicolor optical filters having a very high resolving power and not causing color stains.

These objects of the present invention are attained by a process for forming color images which comprises providing a light absorbing dye layer or a dye containing layer on a base at least the surface of which is composed of a transparent dye accepting polymer, imagewise exposing the dye layer or the dye-containing layer to light having a high energy density to form a dye image in said dye accepting polymer by thermally diffusing the dye in the exposed area, and removing the dye layer or the dye-containing layer remaining on the dye accepting polymer surface (in the unexposed areas).

Further, in case of producing a multicolor optical filter used for color camera tubes or color solid-state camera devices according to the present invention, the above described process is repeated a desired number of times using different colors after the first color image is formed on the dye accepting polymer layer as described above.

DETAILED DESCRIPTION OF THE INVENTION

As the transparent base used in the present invention, films having a dye accepting property and glass, quartz or polymer films on which a dye accepting layer is formed can be used. The term "transparent" is used herein with respect to the radiation (wavelengths) to which the camera device, as one example, is sensitive. Further, it is possible to use bases in which a dye accepting layer is provided on a light receiving surface of a solid-state camera device. Materials having a dye accepting property are selected from polyesters, polycarbonates, cellulose triacetate, cellulose diacetate, polyvinyl alcohols, polyimides, polyvinyl butyral, polyvinyl formal, polyvinylcarbazole, polyvinylpyrrolidone, polystyrene, poly-α-methylstyrene, methacrylic acid ester polymers such as poly-methyl methacrylate or poly-isobutyl methacrylate, etc. poly(acrylic acid amides) such as poly-diacetone-acrylamide or polyacrylamide, etc., chlorinated polyethylene, phenol resins, novolak resins and urea- or melamine-formaldehyde resins.

Polyesters, which are the most effectively used as the dye accepting material, include polyethylene terephthalate, polyesters described in U.S. Pat. No. 4,081,277 such as poly-[4,4'-isopropylidenediphenylene-co-4,4-hexahydro-4,7-methanoindene-5-ylidenediphenylene (molar ratio 50:50) terephthalate co-isophthalate (molar ratio 50:50)] or poly-(4,4'-hexahydro-4,7-methanoindene-5-ylidenediphenylene terephthalate), etc., and polyethylene isophthalate.

These dye accepting polymers may be used in combinations of two or more in order to obtain the property desired. Particularly, it is possible to increase the amount of dyes capable of being introduced into the polymer by using two polyesters together. Of course, copolymers may be used. The dye accepting polymer is formed into a film by fusing and stretching, or the polymer is dissolved in water and/or an organic solvent and the resulting solution is applied to a base and dried to form a layer. In the case of application to the base, the dye accepting polymer layer is about 0.5 μm to 300 μm and preferably about 1 μm to 200 μm.

As the base, it is possible to use films composed of glass, quartz or high molecular compounds, a base of semiconductor photosensors such as a CCD, CID or BBD, etc., a base in which a silicon dioxide layer is formed on the surface of said semiconductor photosensor, a glass plate having a transparent conductive film, e.g., of $In_2O_3$, $SnO_2$, etc. or a film of high molecular compounds, e.g., conductive polyester film, etc. It is preferred to provide a subbing layer on the surface of the base in order to enhance adhesion of the base to the dye accepting polymer layer.

The dyes suitable for use in the present invention are those which do not decompose at a temperature lower than their melting point but diffuse into the dye accepting layer by heating. Examples of the effective dyes are shown in the following table.

| Dye No. | Dye | Supplier |
|---|---|---|
| 1 | Eastman Polyester Blue GBN | Eastman Kodak Co. |
| 2 | Eastman Brilliant Red FFBL | Eastman Kodak Co. |
| 3 | Eastman Polyester Blue BNN | Eastman Kodak Co. |
| 4 | Eastman Polyester Yellow 7GT | Eastman Kodak Co. |
| 5 | Kayaset Blue 906 | Nippon Kayaku K.K. |
| 6 | Kayalon Polyester Blue GRF | Nippon Kayaku K.K. |
| 7 | Kayalon Polyester Orange RSF | Nippon Kayaku K.K. |
| 8 | Kayalon Fast Red R | Nippon Kayaku K.K. |
| 9 | Celliton Fast Yellow RR | B. A. S. F. |
| 10 | Celliton Orange R | B. A. S. F. |
| 11 | Celliton Fast Blue Green B | B. A. S. F. |
| 12 | Celliton Fast Blue FFR | B. A. S. F. |
| 13 | Sumikalon Yellow FG | Sumitomo Chemical Co. |
| 14 | Sumikalon Orange R | Sumitomo Chemical Co. |
| 15 | Sumikalon Red 3G | Sumitomo Chemical Co. |
| 16 | Sumikalon Violet RS | Sumitomo Chemical Co. |
| 17 | Sumikalon Navyblue GG | Sumitomo Chemical Co. |
| 18 | Lionogen Magenta R | Toyo Ink Co. |
| 19 | Fast Violet Lake | Toyo Ink Co. |
| 20 | Kayaset Red G | Nippon Kayaku K.K. |
| 21 | Kayaset Red 126 | Nippon Kayaku K.K. |
| 22 | Eastman Polyester Red FFBL | Eastman Kodak Co. |
| 23 | Dianix Fast Brilliant Green 3GM/D | Mitsubishi Chemical Industries Ltd. |
| 24 | Copper Phthalocyanine | — |

In the case of forming a dye layer on the base composed of the dye accepting polymer or the base in which the dye accepting polymer layer is formed on the surface, it is possible to use processes such as vacuum evaporation, ionplating or sputtering, etc. to form a layer composed of only the dye. In carrying out these processes, heating is carried out at a comparatively low temperature in vacuum in order to prevent thermal decomposition, isomerization or rearrangement of the dye, by which a uniform layer can be produced on the base. In the case of producing a dye containing layer on the base, a solution prepared by dissolving or dispersing the dye in a solution containing a high molecular compound as a binder is applied to the base and dried. The dye content of such a layer is generally about 2 to 80 wt. %. As the binder, high molecular compounds soluble in solvents are used. For example, it is possible to use known binders such as gelatin, polyethylene terephthalate, polycarbonate, cellulose triacetate, cellulose diacetate, ethylcellulose, polyvinyl butyral, polyvinyl formal, polyvinyl alcohol, polyvinylpyrrolidone, polyvinyl chloride or polyvinylidene chloride, etc. The dye layer is about 100 Å to 20,000 Å and preferably about 300 Å to 4000 Å thick. The dye-containing layer is about 0.2μ to 100μ and preferably about 0.5μ to 20μ thick.

As the high energy density light source xenon lamps, high pressure mercury vapor lamps, extra-high pressure mercury vapor lamps, tungsten lamps, sodium vapor lamps, etc. and a laser can be used.

The laser light can be highly modulated by an image formation signal and is applied to the dye-containing layer by scanning. When a laser flux is focused by a lens in order to increase the energy density and the dye-containing layer is exposed thereto by scanning, a color image can be formed by exposing for a short exposure time of about 10 milli sec or less and, for this purpose, it is possible to use laser light having low power and to form a dye image having excellent sharpness. Exposure to laser light is preferably carried out for about 200μ sec or less so as not to deform the high molecular material by fusing. Further, if the dye is a sublimable material, the optical density of the color image is sometimes higher at a shorter exposure time.

In case of light having a high energy density other than laser light, the light is applied to the dye or dye-containing layer through a mask or the light is applied to a light absorbing material (e.g., carbon black, aniline black) imagewise provided near the dye-containing layer, and the dye or dye-containing layer on the surface is removed to form a dye image.

The present invention is particularly advantageous for the production of multicolor optical filters. In order to produce the multicolor optical filters according to the present invention, a first dye layer or a first dye containing layer is formed on the base the surface of which is composed of a transparent dye accepting polymer. Light having a high energy density is applied thereto in a striped or mosaic pattern such that the dye thermally diffuses in the exposed areas into the dye accepting polymer, and the dye left on the surface of the dye accepting polymer layer is removed to form a first dye image. The same process as described above is repeated using second and third dye layers or second and third dye containing layers to form second dye and third dye patterns. According to the process of the present invention, since thermal diffusion forming the second and the third dye images is selectively carried out by second and third exposures, the dye images formed in the dye accepting polymer are not decomposed and the sharpness of the images does not deteriorate during thermal diffusion.

In case of producing multicolor optical filters for solid-state camera devices such as CCD or CID, it is possible to form each filter element at intervals of at least 1μ.

As a preferred example of the color imaging devices of the present invention, a device having filter elements through which light such as blue, green and red; cyan, magenta and yellow, or white, green and red pass selectively corresponding to each pattern of the semiconductor photosensor elements. For example, a color imaging device through which blue, green and red light pass selectively can be produced by producing in turn color images of blue, green and red in the dye accepting polymer so as to form a certain pattern according to the above described process.

These color images of blue, green and red may be produced by a subtractive process using yellow, cyan and magenta dyes. Many suggestions have already been made for selection of colors and arrangement of color filters, which can be suitably adopted (see, e.g., Japanese Patent Applications (OPI) 13792/77 and 63622/77 and U.S. Pat. B 502,289).

EXAMPLE 1

A sample was produced by vacuum evaporation of the blue dye, Eastman Polyester Blue GBN, on a polyethylene terephthalate film having a thickness of 100μ by a resistance heating in a thickness of 2000 Å.

The vacuum evaporation is carried out at a pressure of 1 to $3\times10^{-5}$ Torrs and an evaporation rate of 100 Å/min. The sample was fixed to a movable stage and an argon ion laser (5145 nm) focused to 20μ was applied to the sample for 100μ sec at 10 Hz while moving the stage at 100μ/sec.

The blue dye was removed from the sample by dissolving in ethyl alcohol by which a round blue image about 12μ in diameter was obtained on the polyester film base.

EXAMPLE 2

0.6 g of polycarbonate resin (Trade name: Iupilon C-3000, produced by Mitsubishi Gas Chemical Ind. Co., molecular weight: 22,000, melting point: 230°-260° C. and glass transition temperature: 130°-155° C.) was dissolved in 12 g of tetrachloroethylene and the resulting solution was applied to a polyethylene terephthalate film 100μ in thickness by a Mayer bar #20 and dried to produce a base. The dry thickness of the polycarbonate was 2.1μ. Using this base, vacuum evaporation of the red dye, Kayaset Red G, was carried out by resistance heating to provide a thickness of 100 Å to produce a sample.

The sample was fixed to a movable stage and argon ion laser (wavelength: 5145 nm) focused to 20μ was applied to the sample for 100 μsec at 10 KHz while moving the stage at 100 μ/sec. The red dye was removed from the sample by dissolving in ethyl alcohol by which a linear red dye image about 12μ in width was formed on the base.

EXAMPLE 3

120 mg of polyvinyl butyral resin (Trade name: Denkabutyral #4000-2, produced by Electro Chemical Industry Co. degree of acetalation: 75 wt% or more, and average degree of polymerization: 1000) was dissolved in 6.0 g of tetrahydrofuran, and 90 mg of the blue dye Kayaset Blue 906 (produced by Nippon Kayaku K.K.) was dissolved in the resulting solution. This solution was applied to a polyethylene terephthalate film by a Mayer bar #20 and dried to produce a sample. This sample was fixed to a movable stage and argon ion laser (wavelength: 5145 nm) focused to 50μ was applied to the sample for 100 μsec pulse exposures at 10 KHz for 45 seconds while moving the stage in the +Y direction at a linear velocity of 100 μ/sec. The sample was then moved +90 μm in the X direction. The argon ion laser was applied under the same direction for 45 seconds while moving the sample in the −Y direction at a linear velocity of 100 μ/sec. The sample was then moved +90 μm in the X direction and the argon laser was applied under the same condition as described above for 45 seconds while moving the sample in the +Y direction. The application of the laser was repeated 62 times. The blue dye was removed from the sample by dissolving in ethyl alcohol, by which a striped blue dye image having a pitch of 90μ and 27μ in width was formed on the polyethylene terephthalate base.

Then, the red dye, Eastman Polyester Red FFBL, was applied to the resulting base having the blue dye image by vacuum evaporation under the same conditions as in Example 1 in a thickness of 1500 Å. The resulting sample was fixed at a prescribed position of a movable stage and moved 30 μm in the +X direction. The argon laser (wavelength: 5145 nm) focused to 50μ was applied to the sample at 30 μ sec pulse exposures at 10 KHz for 45 seconds while moving the sample at a linear velocity of 100 μm/sec in the +Y direction. The sample was moved 90 μm in the +X direction, and the argon laser focused to 50μ was applied under the same condition for 45 minutes while moving the sample in the −Y direction at a linear velocity of 100 μm/sec. The movement of the sample at a pitch of 90 μm in the +X direction and the application of the argon laser with moving the sample was repeated 63 times. The red dye was then removed from the sample by dissolving in ethyl alcohol by which a striped red dye image 28μ in width and 90μ in pitch adjacent the blue dye image was formed on the polyethylene terephthalate base.

Further, the green dye, Dianix Fast Brilliant Green 3GM/D, was applied to the resulting base having the red and blue striped images by vacuum evaporation under a pressure of $2\times10^{-5}$ Torrs at a vacuum evaporation rate of 70 Å/min by resistance heating so as to be 1500 Å in thickness. This sample was fixed at a prescribed position of a movable stage and moved 60 μm in the +X direction. The movement of the sample in the X or the −X direction and the application of the laser under the same condition as in case of forming the blue dye image was repeated 65 times. The green dye was then removed from the sample by dissolution by which a striped green dye image 28μ in width and 90μ in pitch adjacent to the red dye image was obtained.

The resulting multicolor filter having blue, red and green stripes was fixed to a sensing area of CCD (charge coupled device: CCD-211, produced by Fairchild Co.) to produce a color imaging device.

EXAMPLE 4

The same polycarbonate solution as in Example 2 was applied to the sensitive face of the charge coupled device (CCD-211, produced by Fairchild Co.) to produce a dye accepting polycarbonate layer. Further, a positive photoresist (AZ-1251, produced by Shipley Co.) was applied thereto. The sensitive face was exposed to light by a mercury vapour lamp and developed to remove the photoresist on the sensitive face, and the fringe of the sensitive face was protected with a resist to make a base. Using this base, copper phthalocyanine was applied by vacuum evaporation in the same manner as in Example 1. Argon laser (30 W, 30 μsec) was applied intermittently to the sensitive face to form a blue image. Red and green mosaic dye image were formed in the polycarbonate layer closely contacting the CCD-211 in the same manner as in Example 3 to produce a CCD-multicolor filter composite. In this composite, sensitive elements responded to blue, red and green light.

EXAMPLE 5

3.5 g of poly-(4,4'-hexahydro-4,7-methanoindane-5-ylidenediphenylene terephthalate was dissolved in a mixture composed of 37 ml of toluene and 20 ml of dichloromethane with stirring. The solution was applied to a quartz disk, to which chromium was applied by vacuum evaporation in an optical density of 0.05, by a spinner under a condition of 1000 rpm for 40 seconds and dried at 120° C. for 4 hours to produce a base. To this base, the red dye, Kayaset Red 126, was applied by vacuum evaporation by resistance heating in a thickness of 2000 Å to produce a sample. Argon laser was applied under the same condition as in Example 2. The red dye was then removed from the sample by dissolving ethyl alcohol by which a linear red image 10μ in width was obtained on the base. Using the green filter: BPB-B53 (produced by Fuji Photo Film Co.), the density of the red image was measured by means of a microdensitometer; and 0.60 of maximum optical density was obtained.

EXAMPLE 6

3.0 g of poly-(4,4'-hexahydro-4,7-methanoindane-5-ylidenediphenylene terephthalate) and 6.0 g of poly-[4,4'-isopropylidene-diphenylene-co-4,4'-hexahydro-4,7-methanoindane-5-ylidenediphenylene(50:50)terephthalate-co-isophthalate(50:50)] were dissolved in a mixture composed of 37 ml of toluene and 20 ml of dichloromethane. This solution was applied under the same condition as in Example 5 to produce a base and the red dye, Kayaset Red 126, was applied to the resulted base by vacuum evaporation. Argon laser was applied thereto and the red dye was then removed from the sample by dissolving in ethyl alcohol, by which a linear red dye image having 10μ of the width was obtained on the base. When density was measured by means of a microsensitometer with using the green filter BPB-53, the maximum optical density was 0.75, which was higher than the density obtained in Example 5.

While the invention has been described in detail and with reference to specific embodiments thereof, it will be apparent to one skilled in the art that various changes and modifications can be made therein without departing from the spirit and scope thereof.

What is claimed is:

1. A process for forming color micro patterns having high resolving power which comprises forming only a light absorbing dye layer or a light absorbing dye-containing layer directly on a base, at least the surface of which is composed of a transparent dye accepting polymer through which dyes are capable of thermally diffusing, imagewise exposing said dye layer or said dye-containing layer to light having a high energy density such that a dye image is formed in said dye accepting polymer of said base corresponding to the exposed area by thermal diffusion of the dye into the dye accepting polymer of said base, and thereafter removing by dissolving the dye or the dye-containing layer in the unexposed areas.

2. The process of claim 1, wherein a multi-color optical filter is formed.

3. The process of claims 1 or 2, wherein said dye accepting polymer is selected from the group consisting of polyesters, polycarbonates, cellulose triacetate, cellulose diacetate, polyvinyl alcohols, polyimides, polyvinyl butyral, polyvinyl formal, polyvinyl carbazole, polyvinyl pyrrolidone, polystyrene, poly-α-methylstyrene, methacrylic acid ester polymers, poly(acrylic acid amides), chlorinated polyethylene, phenol resins, novolak resins, urea-formaldehyde resins, and melamine-formaldehyde resins.

4. The process of claims 1 or 2, wherein said dye accepting polymer comprises a polyester.

5. The process of claims 1 or 2, wherein said base comprises a semi-conductor photosensor.

6. The process of claims 1 or 2, wherein said process is conducted two or three times.

7. The process of claim 6, wherein red, green and blue color patterns are respectively formed with each execution of said process.

8. The process of claim 6, wherein cyan, magenta, and yellow coupler patterns are respectively formed with each execution of said process.

9. The process of claim 1 or claim 2, wherein said light having a high energy density is laser light.

* * * * *